United States Patent [19]

Menut

[11] Patent Number: 5,406,134
[45] Date of Patent: Apr. 11, 1995

[54] BISTABLE FLIP-FLOP WITH RESET CONTROL

[75] Inventor: Bruno P. Menut, 7 Allée Jean-Philippe Rameau, France

[73] Assignee: SGS-Thomson Microelectronics S.A., Gentilly, France

[21] Appl. No.: 71,078

[22] Filed: Jun. 2, 1993

[30] Foreign Application Priority Data

Jun. 5, 1992 [FR] France ............................. 92 06871

[51] Int. Cl.⁶ .............................................. H03K 3/289
[52] U.S. Cl. ................................. 327/203; 327/202; 327/208
[58] Field of Search ............... 307/279, 272.2, 289, 307/443, 272.1, 288; 377/79, 107, 117, 111, 74

[56] References Cited

U.S. PATENT DOCUMENTS

| | | | |
|---|---|---|---|
| 3,930,169 | 12/1975 | Kuhn, Jr. | 377/107 |
| 4,181,862 | 1/1980 | Dinguall | 377/107 |
| 4,785,200 | 11/1988 | Huntington | 307/279 |
| 4,806,786 | 2/1989 | Valentine | 307/279 |
| 4,816,702 | 3/1989 | Salina et al. | 307/279 |
| 4,974,241 | 11/1990 | McClure et al. | 307/279 |
| 5,051,610 | 9/1991 | Terane et al. | 307/279 |
| 5,175,753 | 12/1992 | Gaglani | 377/117 |

FOREIGN PATENT DOCUMENTS

0472426  2/1992  European Pat. Off.

OTHER PUBLICATIONS

Patent Abstracts of Japan, vol. 10, No. 283 (E-440)(2339) Sep. 26, 1986 & JP-A-61 101 113 (Toshiba Corp.) May 20, 1986.
Patent Abstracts of Japan, vol. 10, No. 99 (E-396)(2156) Apr. 16, 1986 & JP-A-60 241 320 (Nippon Denki K.K.) Nov. 30, 1985.

*Primary Examiner*—Timothy P. Callahan
*Assistant Examiner*—My-Trang Nu Ton
*Attorney, Agent, or Firm*—Wolf, Greenfiled & Sacks

[57] ABSTRACT

A bistable flip-flop with reset control is provided. The flip-flop includes a storage cell having a first inverter whose input can receive a write signal from an input signal delivered to the input terminal of the first inverter, and a second inverter which is feedback-mounted with respect to the first inverter. The flip-flop also includes a first switch controlled by a reset signal for enforcing a specified logic state at the input of the first inverter when the reset signal is active, and a second switch controlled by the reset signal so as to prevent the first inverter from receiving a write signal in a logic state opposite to the specified state when the reset signal is active.

8 Claims, 1 Drawing Sheet

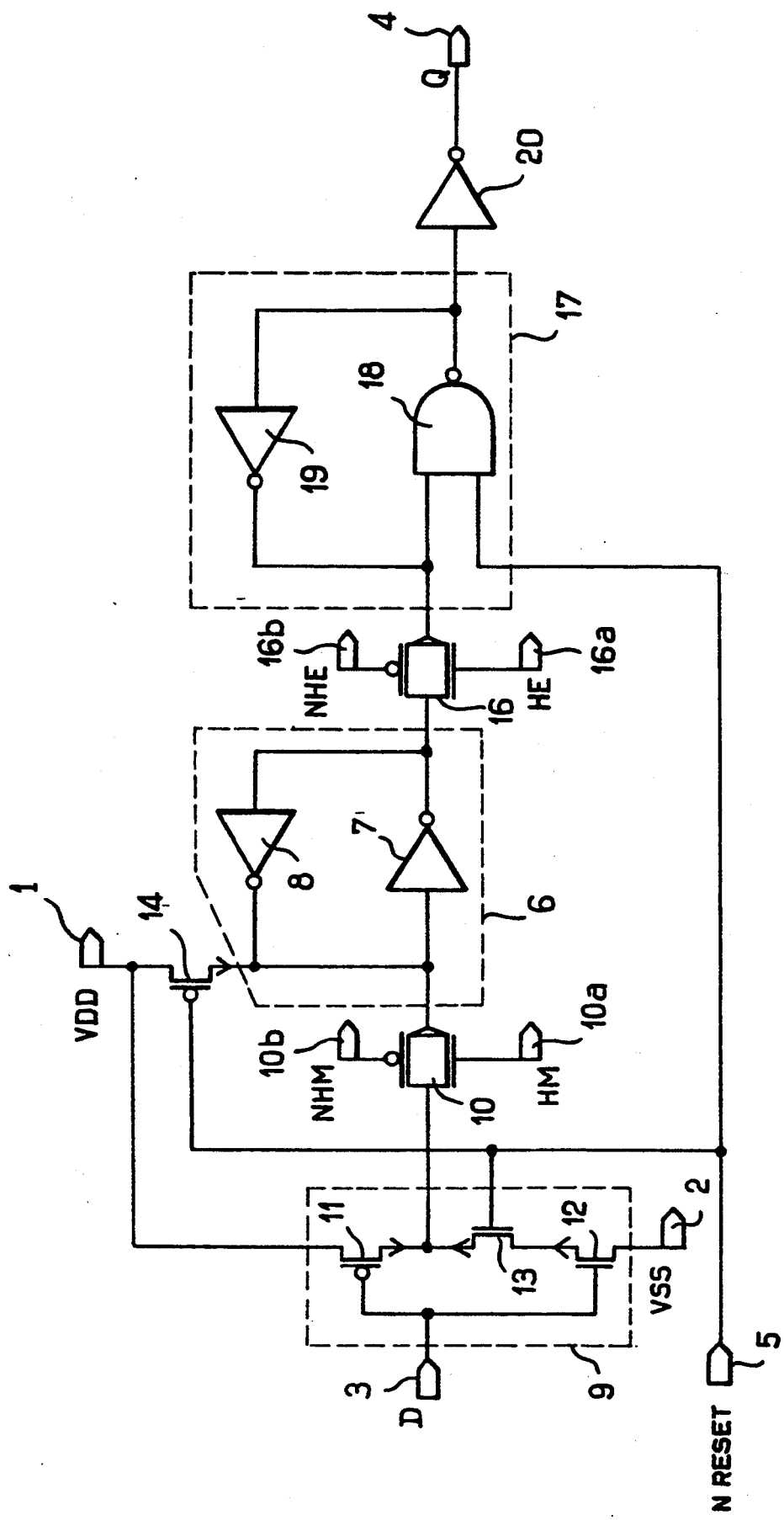

BISTABLE FLIP-FLOP WITH RESET CONTROL

BACKGROUND OF THE INVENTION

1. Field of the Invention

The present invention relates to a bistable flip-flop with reset control.

2. Discussion of the Related Art

D flip-flops produced by CMOS (complementary metal-oxide semiconductor technology customarily include a master stage and a slave stage which are clocked by offset clock signals. Each stage consists of a storage cell including two logic gates mounted in parallel, one of these two gates being feedback-mounted with respect to the other in order to provide for the storage function. In order to compensate for the leakage currents and thus provide for the stability of the stored information, the feedback-mounted logic gate is produced from resistive-channel MOS transistors, that is to say including a relatively long channel and a relatively long gate. These resistive-channel transistors occupy a sizeable area on an integrates circuit, and it is therefore generally sought to reduce their number in order to obtain the functionalities desired of a compact circuit.

The resetting of the D flip-flop must be performed simultaneously on the two stages on the basis of the same control signal. Conventionally, the master stage includes a NAND gate feedback-mounted with respect to an inverting gate, and the resetting of this master gate is provided for by one of the inputs of this NAND gate receiving the active reset control signal in the 0 state. This NAND gate requires four resistive-channel MOS transistors and is therefore relatively bulky in terms of integrated circuit area. Furthermore, this NAND gate must be supplemented with other logic elements intended to avoid write conflicts at the input of the inverting gate.

SUMMARY OF THE INVENTION

In view of the foregoing, the aim of the present invention is to propose a bistable flip-flop, in particular of the delay type, occupying a reduced area, so as to increase the density of layout of an integrated circuit comprising flip-flops of this type.

According to the present invention, this aim is achieved with a bistable flip-flop comprising at least one input terminal, one output terminal, one reset control terminal and one storage cell, in which the storage cell comprises a first inverter having an input capable of receiving a write signal dependent on an input signal delivered to the input terminal and an output, wherein the storage cell comprises a second inverter having an input connected to the output of the first inverter and an output connected to the input of the first inverter, and wherein the flip-flop furthermore comprises a first switch controlled by a reset signal for selectively connecting the input of the first inverter to a reference terminal of the flip-flop and thus enforcing a specified logic state at the input of the first inverter when the reset signal is in an active state, and a second switch controlled by the reset signal and arranged to prevent the input of the first inverter from being able to receive a write signal in a logic state inverse to said specified state when the reset signal is in its active state.

Thus, the feedback-mounted logic gate in the storage cell of the present invention is an inverter which typically requires just two resistive-channel transistors. The flip-flop therefore has a smaller surface area than that of conventional flip-flops. The reset function is carried out by the two switches, the first enforcing the resetting of the cell whilst the second prevents signal conflicts at the input of the first inverter.

BRIEF DESCRIPTION OF THE DRAWING

Other features and advantages of the present invention will emerge in the detailed description below of a preferred and non-limiting embodiment, read jointly with the attached drawing in which the single FIGURE represents an electrical diagram of a flip-flop according to the present invention.

DETAILED DESCRIPTION

The FIGURE illustrates a delay flip-flop (D flip-flop) with reset control produced according to the invention. The inputs and outputs of this flip-flop are as follows:

reference terminal 1 receiving the circuit's positive supply voltage VDD representative of the 1 logic state;

reference terminal 2 receiving the earth voltage VSS representative of the 0 logic state;

input terminal 3 receiving the binary input signal D of the flip-flop;

output terminal 4 delivering the binary output signal Q of the flip-flop;

reset control terminal 5 receiving an active binary reset signal NRESET in the 0 logic state;

master clock terminals 10$a$, 10$b$ respectively receiving a master clock signal HM and the logic inverse NHM of this master clock signal; and slave clock terminals 16$a$, 16$b$ respectively receiving a slave clock signal HE and the logic inverse NHE of this slave clock signal.

The flip-flop comprises a master stage 6 and a slave stage 17 each consisting of a storage cell. The input of the master stage 6 is connected to the input terminal 3 of the flip-flop by way of a gate 9 and an interrupter 10. The output of the master stage 6 is connected to the input of the slave stage 17 by way of an interrupter 16. The output of the slave stage 17 is connected to the output terminal 4 of the flip-flop by way of an inverter 20.

The gate 9, whose structure will be detailed further on, produces a write signal which is the logic inverse of the input signal D and, under certain conditions, transmits this write signal to the interrupter 10. The interrupter 10 consists conventionally of an n-channel MOS transistor whose gate receives the master clock signal HM and of a p-channel MOS transistor whose gate receives the inverted master clock signal NHM, these two transistors being mounted with their channels in parallel. The interrupter 10 is therefore open when HM=0 and closed when HM=1.

The storage cell 6 forming the master stage comprises a first inverter 7 whose input is connected to the interrupter 10 and a second inverter 8 whose input is connected to the output of the first inverter 7 and whose output is connected to the input of the first inverter 7. As explained earlier, the feedback-mounted second inverter 8 consists conventionally of resistive-channel MOS transistors so as to compensate for the leakage currents in the cell 6.

The output of the first inverter 7 is furthermore connected to the interrupter 16 which is of the same type as the interrupter 10 with an n-channel MOS transistor whose gate receives the slave clock signal HE and a p-channel MOS transistor whose gate receives the inverted slave clock signal NHE. The interrupter 16 is therefore open when HE=0 and closed when HE=1.

The slave stage 17 consists of a storage cell comprising conventionally a NAND gate 18 having a first input connected to the interrupter 16, a second input connected to the reset control terminal 5 and an output connected to the output terminal 4 of the flip-flop by way of the inverter 20. The slave stage 17 furthermore comprises an inverter 19 feedback-mounted with respect to the NAND gate 18 with its input connected to the output of the NAND gate 18 and its output connected to the first input of the NAND gate 18. The inverter 19 consists of resistive-channel MOS transistors in order to compensate for the leakage currents in the slave stage 17.

The master and slave clock signals HM, HE are signals of like frequency, offset temporally in order to provide for the master/slave operation of the two stages 6, 17, and non-overlapping in the high state in order to avoid any problem of transparency of the flip-flop. Typically, the master clock signal HM can have a duty cycle of 0.5 and the slave clock signal HE can be the logic inverse of this signal HM.

The resetting of the slave stage 17 is carried out by way of the second input of the NAND gate 18. When the reset signal is active (NRESET=0), the slave stage 17 is in the 1 state on its output and the output signal Q is reset to the 0 state. This state of the slave stage 17 is maintained until the reset command disappears and a signal in the 1 state arrives at the first input of the NAND gate 18 by way of the interrupter 16.

For the simultaneous resetting of the master stage 6, the flip-flop comprises a first switch 14 consisting, in the example represented, of a p-channel MOS field-effect transistor 14 whose gate is connected to the reset control terminal 5. The channel of the transistor 14 is mounted between the reference terminal 1 at the voltage VDD and the input of the first inverter 7 of the master stage 6. When NRESET is in the active state, the switch 14 is closed and the 1 logic state is enforced at the input of the inverter 7, so that the output of the master stage 6 is reset to the 0 state.

The flip-flop furthermore comprises a second switch 13 arranged to prevent the input of the first inverter 7 from being able to receive a write signal in the 0 logic state inverse to that enforced by the first switch 14 when the reset signal NRESET is active. In the example represented, the second switch 13 is an n-channel MOS field-effect transistor included in the logic gate 9, the gate of the transistor being connected to the reset control terminal 5.

The logic gate 9 comprises, apart from the second switch 13, two MOS field-effect transistors of different polarities 11, 12 whose respective gates are connected to the input terminal 3 of the flip-flop. The p-channel MOS transistor 11 has its source connected to the reference terminal 1 at the voltage VDD and its drain connected to the interrupter 10. The n-channel MOS transistor 12 has its channel mounted in series with that of the transistor 13 forming the second switch between the reference terminal 2 at the voltage VSS and the interrupter 10. In the example represented, the n-channel transistor 12 has its drain connected to the reference terminal 2 and its source connected to the drain of the transistor-switch 13 whose source is connected to the interrupter 10. It is seen that apart from the switch 13, the gate 9 has the conventional structure of a CMOS inverter. The write signal which can be addressed to the input of the master stage 6 when the interrupter 10 is closed is the inverse of the input signal D. However, during a reset command, the switch 13 is open (NRESET=0), thus preventing the transmission of a write signal in the 0 state which could create a conflict of data at the input of the inverter 7 and occasion a short-circuit between the reference terminals 1, 2.

The delay flip-flop represented in the FIGURE has optimal compactness since it uses a minimum number of resistive-channel transistors which are bulky elementary components in terms of area. By comparison with a flip-flop without reset control, in the preferred example, the addition of this control requires just two extra transistors (the switches 13 and 14) which are not of resistive-channel type.

Although the invention has been described with regard to a preferred example, it will be understood that this example is not limiting and that diverse variants may be made thereto without departing from the scope of the invention.

Thus, a flip-flop with a single stage can incorporate the invention, which is not limited to a two-stage D flip-flop operating in master/slave mode. Moreover, the invention is clearly not limited to the particular configuration of the logic components represented in the FIGURE. For example, the write signal addressed to the input of the storage cell 6 may, as a variant, be equal to the non-inverted input signal D, the second switch 13 then being interposed simply to prevent the transmission of this signal D when the reset control signal is active.

What is claimed is:

1. A bistable flip-flop comprising:
   an input terminal;
   an output terminal;
   a reset control terminal;
   a reference terminal;
   a storage cell including a first inverter having an input capable of receiving a write signal dependent on an input signal delivered to the input terminal and an output, and a second inverter, the second inverter having an input connected to the output of the first inverter and an output connected to the input of the first inverter;
   first switch means, controlled by a reset signal received from the reset control terminal, for selectively connecting the input of the first inverter to the reference terminal such as to enforce a specified logic state at the input of the first inverter when the reset signal is in an active state;
   second switch means, controlled by the reset signal, for preventing the input of the first inverter from receiving a write signal in a logic state inverse to said specified state when the reset signal is in its active state;
   a first interrupter, controlled by first clock signals, having an output connected to the input of the first inverter;
   a second interrupter controlled by second clock signals offset in time with respect to the first clock signals;
   a NAND gate having a first input connected to the output of the first inverter by way of the second interrupter, a second input connected to the reset control terminal and an output connected to the output terminal; and
   a third inverter having an input connected to the output of the NAND gate and an output connected to the first input of the NAND gate;

wherein the storage cell forms a master stage of the flip-flop; and wherein the NAND gate and the third inverter forms a slave stage of the flip-flop.

2. A flip-flop according to claim 1, wherein the first switch means includes a field-effect transistor having a gate connected to the reset control terminal, and a channel connected between the input of the first inverter and the reference terminal.

3. A flip-flop according to claims 1 or 2, further comprising:

input inversion means, including two field effect transistors of different polarities, for forming the write signal by inverting the input signal;

wherein the second switch means includes a field-effect transistor having a gate connected to the reset control terminal;

wherein the input terminal is connected to the gates of the two field-effect transistors of the input inversion means; and wherein the channel of the field-effect transistor forming the second switch means is mounted in series with the channel of one of the two field-effect transistors of the input inversion means to prevent transmission of the write signal when the reset signal is in its active state.

4. A flip-flop according to claims 1 or 2, wherein the first switch means and the second switch means are two field-effect transistors of different polarities, each transistor of the first switch means and the second switch means having a gate connected to the reset control terminal.

5. A bistable flip-flop comprising:

an input terminal;

an output terminal;

a reset control terminal;

a reference terminal;

a storage cell including a first inverter having an input capable of receiving a write signal derived from an input signal delivered to the input terminal and an output, and a second inverter, the second inverter having an input coupled to the output of the first inverter and an output coupled to the input of the first inverter;

a first switch, controlled by a reset signal receiving from the reset control terminal, coupled to selectively connect the input of the first inverter to the reference terminal such as to enforce a specified logic state at the input of the first inverter when the reset signal is in an active state;

a second switch, controlled by the reset signal, coupled to prevent the input of the first inverter from receiving a write signal in a logic state inverse to said specified state when the reset signal is in its active state;

a first interrupter, controlled by first clock signals, having an output coupled to the input of the first inverter;

a second interrupter controlled by second clock signals offset in time with respect to the first clock signals;

a NAND gate having a first input coupled to the output of the first inverter by way of the second interrupter, a second input coupled to the reset control terminal and an output coupled to the output terminal; and a third inverter having an input coupled to the output of the NAND gate and an output coupled to the first input of the NAND gate;

wherein the storage cell forms a master stage of the flip-flop; and wherein the NAND gate and the third inverter forms a slave stage of the flip-flop.

6. A flip-flop according to claim 5, wherein the first switch includes a field-effect transistor having a gate coupled to the reset control terminal, and a channel coupled between the input of the first inverter and the reference terminal.

7. A flip-flop according to claims 5 or 6, further comprising:

an input inverter, including two field effect transistors of different polarities, deriving the write signal by inverting the input signal;

wherein the second switch includes a field-effect transistor having a gate coupled to the reset control terminal;

wherein the input terminal is coupled to the gates of the two field-effect transistors of the input inverter; and wherein the channel of the field-effect transistor forming the second switch is mounted in series with the channel of one of the two field-effect transistors of the input inverter such as to prevent transmission of the write signal when the reset signal is in its active state.

8. A flip-flop according to claims 5 or 6, wherein the first switch and the second switch are two field-effect transistors of different polarities, each transistor of the first switch and the second switch having a gate coupled to the reset control terminal.

* * * * *